(12) United States Patent
Scott

(10) Patent No.: US 6,867,599 B1
(45) Date of Patent: Mar. 15, 2005

(54) LOAD-PULLED MEASUREMENT WITH REFERENCE CIRCUIT

(75) Inventor: Bentley N. Scott, Garland, TX (US)

(73) Assignee: Phase Dynamics, Inc., Richardson, TX (US)

( * ) Notice: Subject to any disclaimer, the term of this patent is extended or adjusted under 35 U.S.C. 154(b) by 127 days.

(21) Appl. No.: 10/163,521

(22) Filed: Jun. 5, 2002

Related U.S. Application Data

(60) Provisional application No. 60/295,998, filed on Jun. 5, 2001.

(51) Int. Cl.$^7$ .............................................. G01R 23/14
(52) U.S. Cl. ..................... 324/633; 324/76.41
(58) Field of Search .............................. 324/76.41, 633, 324/647, 721, 637, 652, 707, 76.51, 602, 71.1, 641, 639, 664, 338, 632, 665, 667; 73/61.44, 61.49, 61.48, 61.43, 61.41, 73

(56) References Cited

U.S. PATENT DOCUMENTS

| | | | | |
|---|---|---|---|---|
| 5,748,002 A | * | 5/1998 | Scott et al. ................. | 324/633 |
| 5,838,207 A | * | 11/1998 | Zhou et al. ............... | 331/36 C |
| 6,378,370 B1 | * | 4/2002 | Haskell et al. ................ | 73/579 |
| 6,479,977 B1 | * | 11/2002 | Mordkovich ............ | 324/76.51 |

OTHER PUBLICATIONS

Friiso, Trond et al., Complex Permittivity of Crude Oils and Solutions of Heavy Crude Oil Fractions. J Dispersion Science & Technology, 19(1) 93–126 (1998), Marcel Dekker, NY.

* cited by examiner

Primary Examiner—N. Le
Assistant Examiner—Timothy J. Dole
(74) Attorney, Agent, or Firm—Groover & Holmes

(57) ABSTRACT

A load-pulled oscillator system in which the oscillator is switched between a distributed measurement section, coupled to a material being monitored, and a constant lumped reference load.

44 Claims, 5 Drawing Sheets

Proposed New Method

Proposed New Method

Load Pull System Diagram

Basic Oscillator Circuit

Oscillator Housing Design with Heater

LOAD-PULLED MEASUREMENT WITH REFERENCE CIRCUIT

CROSS-REFERENCE TO OTHER APPLICATION

This application claims priority from 60/295,998 filed Jun. 5, 2001, which is hereby incorporated by reference.

BACKGROUND AND SUMMARY OF THE INVENTION

The present invention relates to load-pulled oscillator instrumentation systems and methods.

Background: Load-Pulled Oscillators

It is well known to electrical engineers generally (and particularly to microwave engineers) that the frequency of an RF oscillator can be "pulled" (i.e. shifted from the frequency of oscillation which would be seen if the oscillator were coupled to an ideal impedance-matched pure resistance), if the oscillator sees an impedance which is different from the ideal matched impedance. Thus, a varying load impedance may cause the oscillator frequency to shift. For example, an unbuffered RF oscillator is loaded by an electromagnetic propagation structure which is electromagnetically coupled, by proximity, to a material for which real-time monitoring is desired. The net complex impedance seen by the oscillator will vary as the characteristics of the material in the electromagnetic propagation structure varies. As this complex impedance changes, the oscillator frequency will vary. Thus, the frequency variation (which can easily be measured) can reflect changes in density (due to bonding changes, addition additional molecular chains, etc.), ionic content, dielectric constant, or microwave loss characteristics of the medium under study. These changes will "pull" the resonant frequency of the oscillator system. Changes in the medium's magnetic permeability will also tend to cause a frequency change, since the propagation of the RF energy is an electromagnetic process which is coupled to both electric fields and magnetic fields within the transmission line.

Load-pulled oscillators, which make use of this effect, are an important technique for RF monitoring. A free-running oscillator, typically at VHF or higher frequencies, is electromagnetically coupled to some environment which is desired to be characterized. (For example, an unknown oil/water/gas composition can be flowed through a coaxial probe section.) Since the oscillator is not isolated from the environment being measured, changes in that environment will pull the frequency of oscillation. By monitoring shifts in the frequency of oscillation, changes in the environment being monitored can be seen with great precision. (For example, in compositional monitoring of wellhead flows of oil/gas/water mixtures, the environment being monitored is a medium having a variable composition, and changes in the composition are seen as shifts in the oscillation frequency for a given tuning voltage.)

The load pulled oscillator requires a topology which will support oscillations throughout a change in the load impedance from the capacitive to inductive loading. Typically such an oscillator must cover octave or more bandwidths and remain capable of oscillating into any load impedance or phase within its range.

Extensive work by the present inventor and others has shown that load-pulled oscillators have important capabilities for measurement and characterization. See U.S. Pat. Nos. 4,862,060, 4,996,490, 5,025,222, 5,748,002, and 6,166,551, and PCT applications WO 91/00997 and WO 91/08469, all of which are hereby incorporated by reference. This "load-pulled" technology provides an economical measurement technique which has improved sensitivities by 100× to 1000×over any prior instrumentation for measurement of microwave phase.

Background: Properties of a Dielectric in a Transmission Line

To help explain the use of the load-pull effect in the disclosed innovations, the electromagnetics of a dielectric-loaded transmission line will first be reviewed. If a transmission line is (electrically) loaded with a dielectric material, changes in the composition of the dielectric material may cause electrical changes in the properties of the line. In particular, the impedance of the line, and the phase velocity of wave propagation in the line, may change.

This can be most readily illustrated by first considering propagation of a plane wave in free space. The propagation of a time-harmonic plane wave (of frequency f) in a uniform material will satisfy the reduced wave equation $$(\nabla^2 + k^2)E = (\nabla^2 + k^2)H = 0,$$

where

E is the electric field (vector),

H is the magnetic field (vector), and $\nabla^2$ represents the sum of second partial derivatives-along the three spatial axes.

This equation can be solved to define the electric field vector E, at any point r and time t, as $$E(r,t) = E_0 \exp[i(k \cdot r - \omega t)],$$

where k is a wave propagation vector which points in the direction of propagation and has a magnitude equal to the wave number k, and $\omega$ = Angular Frequency = $2\pi f$.

In a vacuum, the wave number k has a value "$k_0$" which is $$k_0 = \omega/c$$
$$= \omega(\mu_0 \epsilon_0)^{1/2},$$

where $\mu_0$ = Magnetic Permeability of vacuum ($4\pi \times 10^{-7}$ Henrys per meter), $\epsilon_0$ = Electric Permittivity of vacuum ($(1/36\pi) \times 10^{-9}$ Farads per meter), and c = Speed of light = $(\mu_0 \epsilon_0)^{-1/2}$ = $2.998 \times 10^8$ meters/second.

However, in a dielectric material, the wave number k is not equal to $k_0$; instead $$k = \omega/(c(\mu_r \epsilon_r)^{1/2})$$
$$= \omega(\mu_0 \mu_r \epsilon_0 \epsilon_r)^{1/2},$$

where $\mu_r$ = Relative Permeability of the material (normalized to the permeability $\mu_0$ of a vacuum), and $\epsilon_r$ = Relative Permittivity of the material (normalized to the permittivity $E_0$ of a vacuum).

Thus, if the relative permeability $\mu_r$ and/or the relative permittivity $\epsilon_r$ vary, the wave number k and the wave propagation vector k will also vary, and this variation will typically affect the load pulled oscillator frequency.

Background: Frequency Hopping in a Load-Pulled Oscillator

In a typical free-running oscillator, the oscillator frequency is defined by a resonant feedback circuit (the "tank" circuit), and can also be pulled slightly by a reactive load, as noted above. Thus, such an oscillator can be broadly tuned by including a varactor in the tank circuit.

As the oscillator's frequency is thus shifted, the phase difference between the energy incident on and reflected from the load element (which is preferably a shorted transmission line segment) will change. This phase difference will be equal to an exact multiple of 180° at any frequency where the electrical length of the transmission line segment is an exact multiple of $\lambda/4$.

As the oscillator frequency passes through such a frequency (i.e. one where the transmission line segment's electrical length is equal to a multiple of $\lambda/4$), the load's net impedance will change from inductive to capacitive (or vice versa). As this occurs, the frequency of the oscillator may change abruptly rather than smoothly. This jump in frequency will be referred to as a frequency "hop".

For a transmission line of length l which contains a dielectric material of relative dielectric constant $\epsilon_r$, the frequency at which one full wavelength (1$\lambda$) exists in the transmission line is equal to c (the speed of light in vacuum, which is 2.995×10$^8$ meters/second) divided by the length of the line in meters and by the square root of the relative dielectric constant of the material:

$$\text{Frequency}_{1\lambda} = c/(l\epsilon_r^{1/2}).$$

For example, for a one-foot-long line filled with a material having $\epsilon_r$=1, l=12 inches (=0.3048 meters), and $$\text{Frequency}_{1\lambda} = (2.995 \times 10^8)/(0.3048 \times 1.0) \sim 980 \text{ MHz}.$$

However, since one wavelength actually contains two excursions from inductive to capacitive reactive impedances, only one-half wavelength is required to see one frequency hop of the load pulled oscillator. If the transmission line is terminated into a short or an open, the resulting effective length is increased to twice the actual length, since a standing wave is generated (due to the energy incident at the short or open being reflected back to the input of the transmission line). In essence, the energy travels down the line, gets reflected, and travels back to the input. With this taken into account, the first frequency with a wavelength long enough to cause a frequency "hop" of the oscillator is one fourth the length calculated above, or 245 MHz.

Multiples of this first quarter-wavelength frequency will also cause the impedance seen at the input to the transmission line to go from inductive to capacitive reactance. The longer the transmission line, the greater the number of phase transitions that will occur. Longer line length also multiplies the phase changes that are brought about by a change in the dielectric constant. For every one-quarter wavelength change in the effective (electrical) length of the line, the complex impedance seen at the oscillator changes by 180°.

For example, suppose that a given oscillator, coupled into a low loss load with an electrical length of one-quarter wavelength ($\lambda/4$), provides 50 MHz of load pulling frequency change (total excursion through all phases). If the monitored material changes enough to produce a change of only one degree of phase in the electrical length of the load, the oscillator frequency will change by 138.9 kHz. This represents an absolute resolution of 7.2×10$^{-6}$ degrees of phase change for each Hertz of sensitivity. For every additional quarter wavelength of line length, this sensitivity to phase is multiplied by 1.5. This is due to the change in phase being an additive function of every additional quarter wave in the measurement section.

In a typical tuning frequency versus voltage plot for a VCO loaded into a shorted transmission line, the height of the "hop" can be measured by holding the VCO tuning voltage constant, while a transmission line terminated into a short is varied in length[1] to cause a full rotation of the impedance vector seen at the VCO's input port. The resulting data of frequency versus length of the transmission line will show a jump in frequency (a delta frequency from the bottom of the "hop" to the top of the "hop") which coincides with the delta frequency of the "hop" seen when the VCO was swept using the tuning voltage.

Such variable transmission lines are commonly used in the microwave industry, and are referred to as "line stretchers."

Thus, if the VCO is swept across a frequency band and the number of frequency "hops" was counted, the number of "hops" reveals the number of wavelengths in the transmission line.

This provides a means for determination of the range of dielectric constant change in a medium even when it rotates the phase vector multiple times (and therefore, the oscillator frequency returns to the same value multiple times). If the dielectric constant of the material in the transmission line is increased, then the above equations show that the frequency of the first full wavelength is decreased by the square root of the dielectric constant. Additionally, this means that the number of wavelengths at a fixed frequency increases with increasing dielectric constant. These facts imply that the VCO tuning curve will see more "hops" as the dielectric constant is increased due to the increasing fraction or whole wavelengths encountered.

Ideally, the oscillator will not cease oscillations (or break into multiple frequency oscillation or spectral breakup) into any load regardless of the load characteristics. However, this is not a strictly necessary condition for use of the disclosed method and system innovations.

Background: Temperature Dependence of Load-Pulled Oscillator Systems

One drawback of load-pulled oscillator systems is the potential for temperature sensitivity. This follows from the basic architecture of a load-pulled system: since the oscillator must be allowed to shift frequency in response to very small phase shifts across the load, the oscillator is inherently susceptible to other sources of phase shift. One of these is temperature shift: temperature will typically affect the intended and parasitic reactances of wiring and passive elements, as well as the gain and phase shift characteristics of the transistor (or other gain element or elements). Moreover, power detection for incident and reflected power components will also change with Temperature, as will coupling within the directional coupler.

A load pull oscillator will possibly "roll over" if the temperature changes enough to create a 180 degree phase shift: the frequency will then jump through a transition back to a lower or higher frequency causing aliasing of the process data. This worsens the problem of temperature dependence, since the effect of temperature shift can be drastic rather than incremental.

A major use of load-pulled systems is for monitoring production from oil wells (flows of mixed hydrocarbons which may include variable fractions of gas, water, and salt). Such systems are often required to endure harsh environments, and are normally specified to a wide ambient temperature range, e.g. −40° to 140° F.

One approach is to enclose a heater with the electronic circuitry, to heat the components to a constant temperature which is above the ambient range. (For example, with a specified ambient temperature range of −40° to 140° F., such a heater can be maintained at approximately 160 degrees Fahrenheit plus or minus 0.1 degrees.) This artificially stabilized component temperature prevents drift and maintains a fundamentally stable frequency for the load pull oscillator to be referenced against and prediction obtained through polynomial equations as the process changes. The temperature of the process fluid being monitored is also measured, and is corrected for in the microprocessor by use of process curves or polynomial fits to curves.

However, this "brute force" solution has its drawbacks. One is that the high temperature does age the components more rapidly than wished. Another is the power consumption required by the heater.

Background: Load-Switching in Load-Pulled Systems

U.S. Pat. No. 5,748,002 (of common ownership and overlapping inventorship with the present application, and hereby incorporated by reference) discloses (among many other teachings) a probe, for load-pulled oscillator measurements, with the capability for switching between two different load segments. As stated in that patent: "FIG. 4E shows a planar probe 18 with TWO transmission lines 21D (only one of them overlain by an added selective absorption layer), and an RF switch 22' to select which of the two transmission lines 21D will be active. There are many ways to use this capability. For example, one of the two lines can be an uncovered metal trace and the other can be covered with a material which selectively absorbs (or reacts with) a particular chemical . . . This can also be used to provide spatially-resolved differential measurement for detection of spatially-varying characteristics (e.g. material zone boundaries in a distillation or chromatographic column)."

Background: Other Approaches to Electrical Characterization

Various types of apparatus have been proposed for measuring the concentration of one substance in another, particularly the concentration of a liquid or flowable substance in another liquid or flowable substance. These approaches have very different electrical design characteristics from load-pulled techniques, and substantially different performance capabilities.

Various devices which utilize the broad concept of determining composition of matter by measuring changes in a microwave signal are disclosed in U.S. Pat. Nos. 3,498,112 to Howard; 3,693,079 to Walker; 4,206,399 to Fitzky et al.; 4,311,957 to Hewitt et al.; 4,361,801 to Meyer et al.; 4,240,028 to Davis Jr.; 4,352,288 to Paap et al.; 4,499,418 to Helms et al.; and 4,367,440 and 4,429,273, both to Mazzagatti; all of which are hereby incorporated by reference.

Although various systems utilizing microwave transmissivity or signal alteration characteristics have been proposed in the prior art, certain considerations in utilizing microwave energy to detect the presence of the concentration of one medium in another have not been met by prior art apparatus. In particular, it is desirable in certain instances to be able to accurately measure, on a continuous basis, the concentration or change in concentration of one fluid in another and particularly where the concentration of one fluid is a very low percentage of the total fluid flow rate or fluid mixture quantity. It is also desirable that the signal change caused by the presence of one substance or medium in another be easily measured and be relatively error free, again, particularly in instances where measurements of low concentrations of one substance such as a fluid in another substance such as another fluid are being taken. Moreover, it is important to be able to transmit the microwave signal through a true cross section of the composition being sampled or measured to enhance the accuracy of the measurement.

Typical systems for capacitive based measurement have a capacitive element, used for parameter determination, as part of the resonant feedback loop around an active device. This method works well with very low loss systems, but oscillation ceases with even slightly lossy measurements. As the frequency is increased into the microwave region, it becomes difficult to configure the resonant feedback loop due to the increase in loss versus frequency and the wavelength becoming comparable to the path length. In this case the frequency is changed directly by the resonance change in the feedback loop which includes the element that consists of the sample to be measured. This frequency change is limited to the characteristics and loss of the feedback path and can only be changed over a narrow frequency range without cessation of oscillations. This limits the measurement technique to small samples of very low loss.

At higher frequencies (above approximately 100 MHz), the capacitive measurement technique fails to work, due to line lengths and stray capacitances. At such frequencies resonant cavity techniques have been employed. (For example, a sample is placed in a resonant cavity to measure the loss and frequency shift with a external microwave frequency source that can be swept across the resonance with and without the sample in the cavity.) This method uses a highly isolated microwave frequency source which is forced by the user (rather than being pulled by the changing resonance) to change its frequency. This technique too meets substantial difficulties. For example, the use of multiple interfaces without a microwave impedance match at each interface causes extraneous reflections, which tend to hide the desired measurement data. This technique too gives errors with very lossy material, but in this case it is due to the very rounded nature of the resonance curve (which is due to the low Q of the loaded cavity). This rounded curve makes it difficult to determine both the center frequency and the 3 dB rolloff frequency closely enough to be accurate in the measurement.

Another technique which is used encompasses the use of a very sharp rise time pulse to obtain time domain data, from which frequency domain values are then derived through transformation techniques.

In U.S. Pat. No. 4,396,062 to Iskander, entitled Apparatus and Method for Time-Domain Tracking of High-speed Chemical Reactions, the technique used is time domain reflectometry (TDR). This contains a feedback system comprising a measurement of the complex permittivity by TDR means which then forces a change in frequency of the source which is heating the formation to optimize this operation. Additionally it covers the measurement of the complex permittivity by TDR methods.

U.S. Pat. No. 3,965,416 to Friedman appears to teach the use of pulse drivers to excite unstable, bi-stable, or relaxation circuits, and thereby propagate a pulsed signal down a transmission line which contains the medium of interest. The pulse delay is indicative of the dielectric constant of the medium. As in all cases, these are either square wave pulses about zero or positive or negative pulses. The circuit is a pulse delay oscillator where the frequency determining element is a shorted transmission line. The frequency generated is promoted and sustained by the return reflections of each pulse. The circuit will not sustain itself into a load that is lossy, since the re-triggering will not occur without a return signal of sufficient magnitude. In addition, the circuit requires a load which is a DC short in order to complete the DC return path that is required for re-triggering the tunnel diodes.

The frequencies of operation of any pulse system can be represented as a Fourier Series with a maximum frequency which is inversely dependent upon the rise time of the pulse.

Therefore, the system covered in the Friedman patent is dependent upon the summation of the frequency response across a wide bandwidth. This causes increased distortion of the return pulse and prevents a selective identification of the dielectric constant versus frequency. This also forces a design of the transmission system to meet stringent criteria to prevent additional reflections across a large bandwidth.

The low frequency limit of the TDR technique is determined by the time window which is a function of the length of the transmission line. The upper extreme is determined by the frequency content of the applied pulse. In the case of this pulse delay line oscillator, the upper frequency is determined to a greater extent by the quality of impedance match (the lack of extra reflections) from the circuit through to the substance under study. These extra reflections would more easily upset the re-triggering at higher frequencies.

In one case (FIG. 1 of Friedman) the return reflection initiates new pulse from the tunnel diode and therefore sets up a frequency (pulse repetition rate) as new pulses continue to be propagated. This is in essence a monostable multivibrator with the return reflection being the trigger. The problem implied, but not completely covered with this approach, is that due to the delay in pulses, the pulse train can overlap and cause multiple triggers to occur. These are caused by the re-reflections of the original parent pulse. An additional problem is with very lossy dielectrics, which will not provide enough feedback signal to initiate the next pulse. If the dielectric medium is of high enough dielectric constant to contain more than one wavelength, or if the dielectric constant of the samples vary greatly, multiple return reflections will alter the behavior of the circuit to render it useless due to the interfering train of return and parent pulses.

FIG. 3 of Friedman shows a bistable multivibrator which senses the return pulse by sampling and feeding back enough phase shifted voltage to re-set the tunnel diodes. Since this device is also dependent upon the return to trigger or re-trigger the parent pulse, it suffers problems with lossy dielectrics and high dielectric constant mediums.

To overcome these problems, the relaxation oscillator of FIG. 4 of Friedman was proposed that contains a RC (resistor/capacitor timing) network which will maintain the generation of pulse trains using resistor 76 and capacitor 78 with the dielectric filled transmission line affecting the regeneration of the pulses as the reflected parent pulse voltage is returned. Since the RC time constant is defining the basic repetition rate, some improvement is obtained in reducing second order effects. The transmission line is still an integral part of the overall relaxation oscillator and lossy dielectrics may cause irregular circuit response. The proposed inverting amplifier as the pulse generator will not function at above approximately 1 MHz in frequency due to the characteristics of such inverting amplifiers. The tunnel diode can pulse up to a 100 MHz rate.

By contrast, the innovative system embodiments disclosed in the present application and its parents differ from the known prior art in using a microwave frequency generated by a free running sine wave oscillator. The preferred oscillator has the versatile capability to work into a wide variety of transmission lines or other load impedance without generation of spurious data or cessation of oscillations. It will continue to oscillate with very lossy dielectrics. It is not a relaxation oscillator or a multivibrator. The frequency of the un-isolated oscillator is dependent upon the net complex impedance of the transmission line and will work into an open circuit as well as a short circuit. The net complex impedance at the frequency of operation of the oscillator looking at the transmission line containing the medium of interest results in stable oscillations through pulling of the unisolated oscillator. Only one frequency at any one time is involved in the disclosed system proposed (not counting harmonics which are at least 10 dB down from the fundamental). This provides for well defined information and eases the transmission design criteria. This also provides for evaluation of the dielectric constant versus frequency which can improve resolution of constituents or ionic activity.

Another important difference from prior art is the separation of the load of interest from the resonant circuit proper. The configuration used isolates the two through the transistor. It is the non-linear behavior of the transistor that provides the changes in frequency as the load is changed. The loop gain of an oscillator must be unity with 180° phase shift. The initial gain of the transistor must be greater before oscillations begin in order for the oscillator to be self starting. This extra gain is reduced to unity by the saturation of the active device upon establishment of the oscillatory frequency. Saturating a device changes the gain (and accordingly the phase since it is non-linear) to maintain oscillations as the load changes. This will continue as the load changes as long as the transistor has appropriate phase and available gain to satisfy oscillations.

Load-Pulled Measurement with Reference Circuit

The present application describes a way to perform load-pulled operation without a heater (or at least with reduced heater requirements). This is done by switching in a reference load element, and driving the voltage-controlled-oscillator to a desired starting frequency. The oscillator stage is then connected to the measurement load (i.e. the section which is electrically coupled to the substance being monitored).

In one class of embodiments, the temperature of the circuitry is monitored, and the starting frequency is adjusted to compensate for non-linear effects of temperature on transistor gain or other parameters which interact with temperature compensation of the entire circuit.

Optionally the temperature of the substance being measured can also be measured, and used for further corrections.

The disclosed innovations, in various embodiments, provide one or more of at least the following advantages:
  Reduces power dissipation by up to 30 watts
  Makes the circuit intrinsically safer (due to reduced power dissipation)
  Reduces cable sizes feeding the oscillator circuit from remote electronics
  Simplifies the overall control and protection scheme
  Lower voltage supply
  Removes isolation circuits between the unregulated heater supply 28–32 VDC and 5VDC and 12VDC.
  Shut down when heater is not pulling current safety circuit is removed.

Note that temperature compensation is not the only result of the disclosed improvements: more generally the innovations can be described as a way to achieve optimal operating point compensation. This includes not only temperature compensation, but also compensation for other sources of variation and error.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation).

Figure 2A:
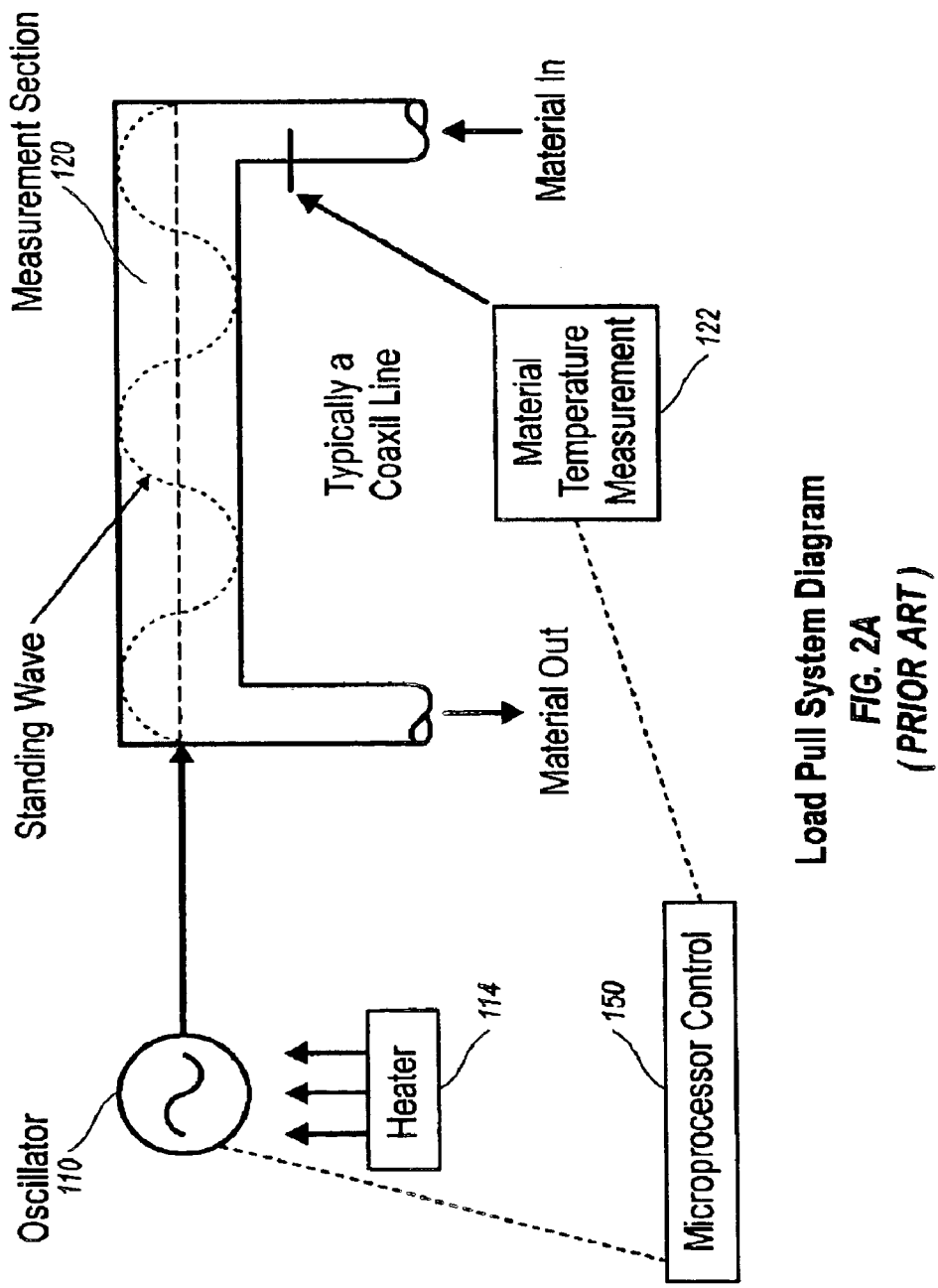
FIG. 2A shows the general elements of a load-pulled system.

FIG. 2A shows the general elements of a load-pulled system. An RF oscillator 110 is coupled to a measurement section 120. Typically this is a large coaxial line through which a stream of fluid passes (as shown), but many other configurations can be used, as detailed in the references cited above. A heater 114 stabilizes the temperature of the oscillator 110, under the control of a microprocessor control stage 150 (which also sets the tuning voltage of oscillator 110, and reads its operating frequency). A temperature sensor 122 also permits the microprocessor to monitor the temperature of the fluids flowing through the measurement section.

Figure 2B:
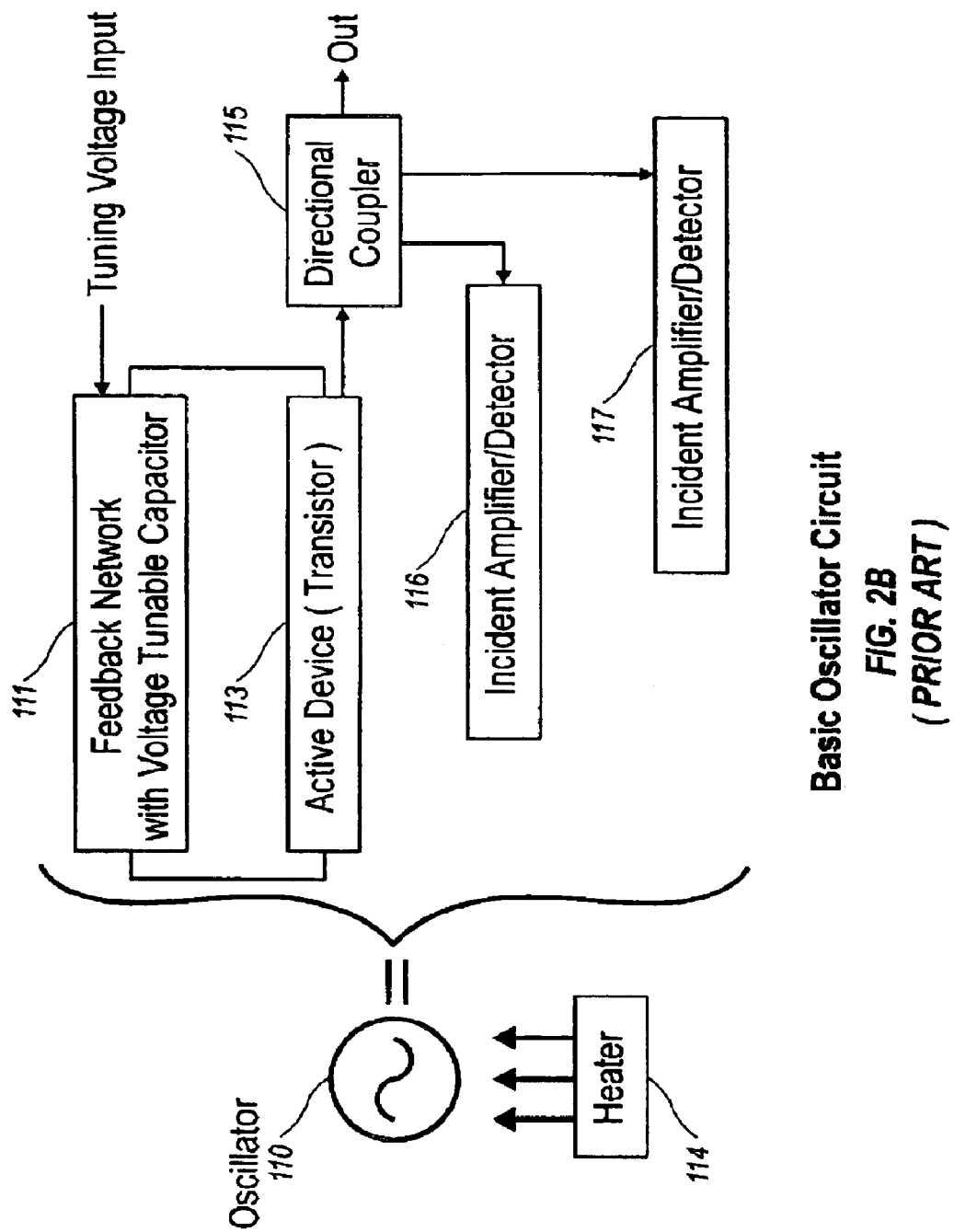
FIG. 2B shows details of the oscillator stage.

FIG. 2B shows some key details of the oscillator stage. The active device 113 which actually provides RF gain gate and source (or base and emitter) connected through a feedback network 111, which includes a tunable reactance (e.g. a voltage-tuned capacitor, or "varactor.") This feedback network is also connected, through a directional coupler 115, to be loaded by the measurement section 112. The directional coupler 115 also permits incident and reflected RF amplitudes to be measured by amplifier/detector stages 116 and 117, respectively.

Many of the "glue" elements in this system are not shown explicitly, e.g. a divider and/or counter can be used to help the microprocessor control stage 150 monitor the frequency of the oscillator 110, and a DAC can be used to help the microprocessor control stage 150 set the oscillator's tuning voltage. Similarly, additional inductances and capacitances are typically used for isolation, to avoid unwanted cross-coupling and parasitic modes. Those skilled in the art of RF instrumentation design will readily understand the appropriate use (or not) of these and other such elements. However, note the oscillator 110 is preferably NOT isolated from the measurement section 110; this is quite different from normal practice in systems which are not load-pulled.

Figure 2C:
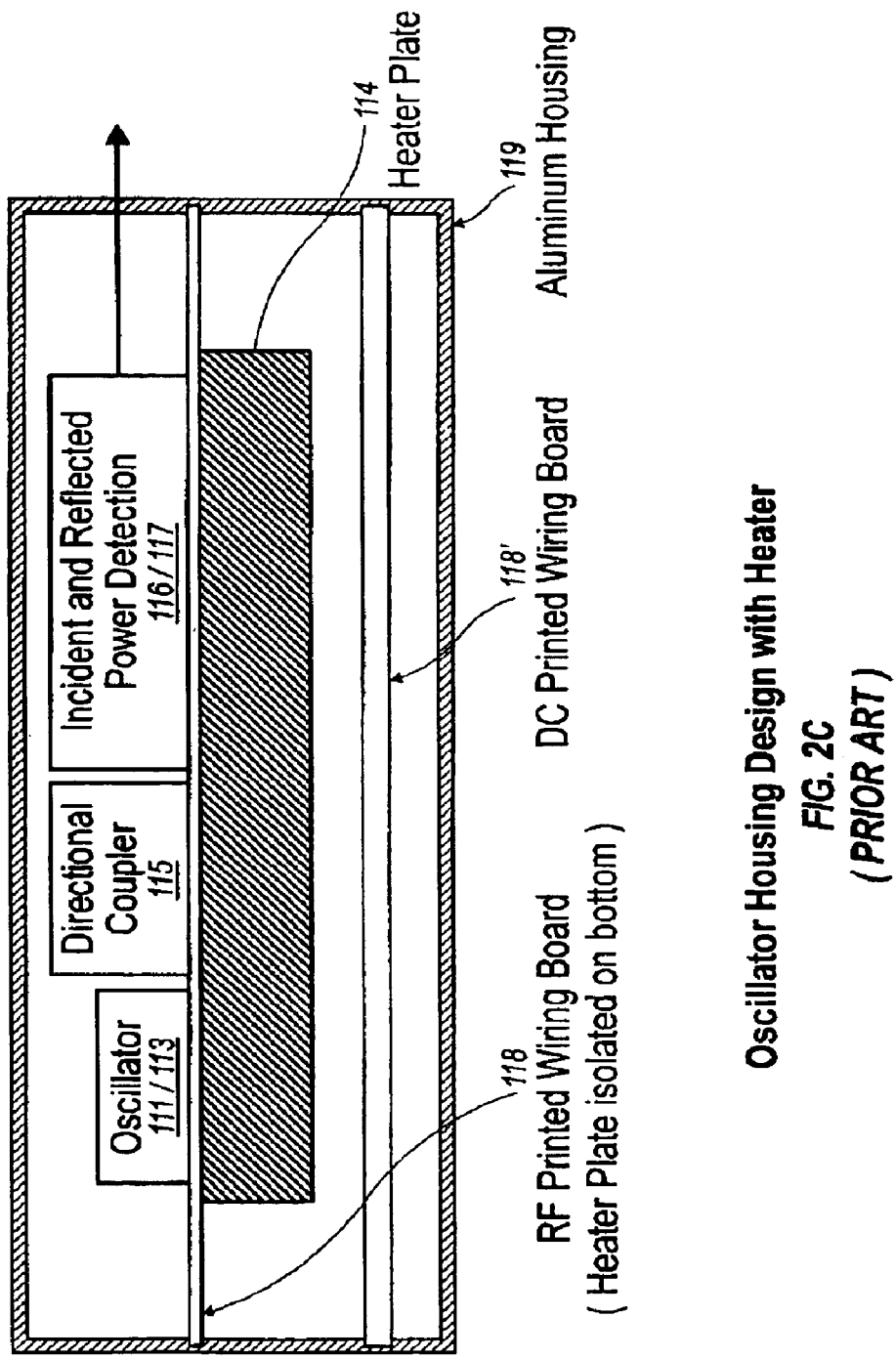
FIG. 2C shows how the electrical elements are conventionally mounted with a heater.

FIG. 2C shows how the electrical elements of FIGS. 2A and 2B are conventionally mounted with a heater. The core elements of the oscillator 111/113, directional coupler 115, and incident/reflected detection stages 116 and 117 are all mounted on an RF wiring board 118, which is backed by a heater plate 114. A second board-("DC PWB" 118') supports the RF board 118 through standoffs (not shown), and is used to route DC power. All these elements are enclosed by an aluminum housing 119 which provides environmental protection and RF shielding.

Figure 1A:
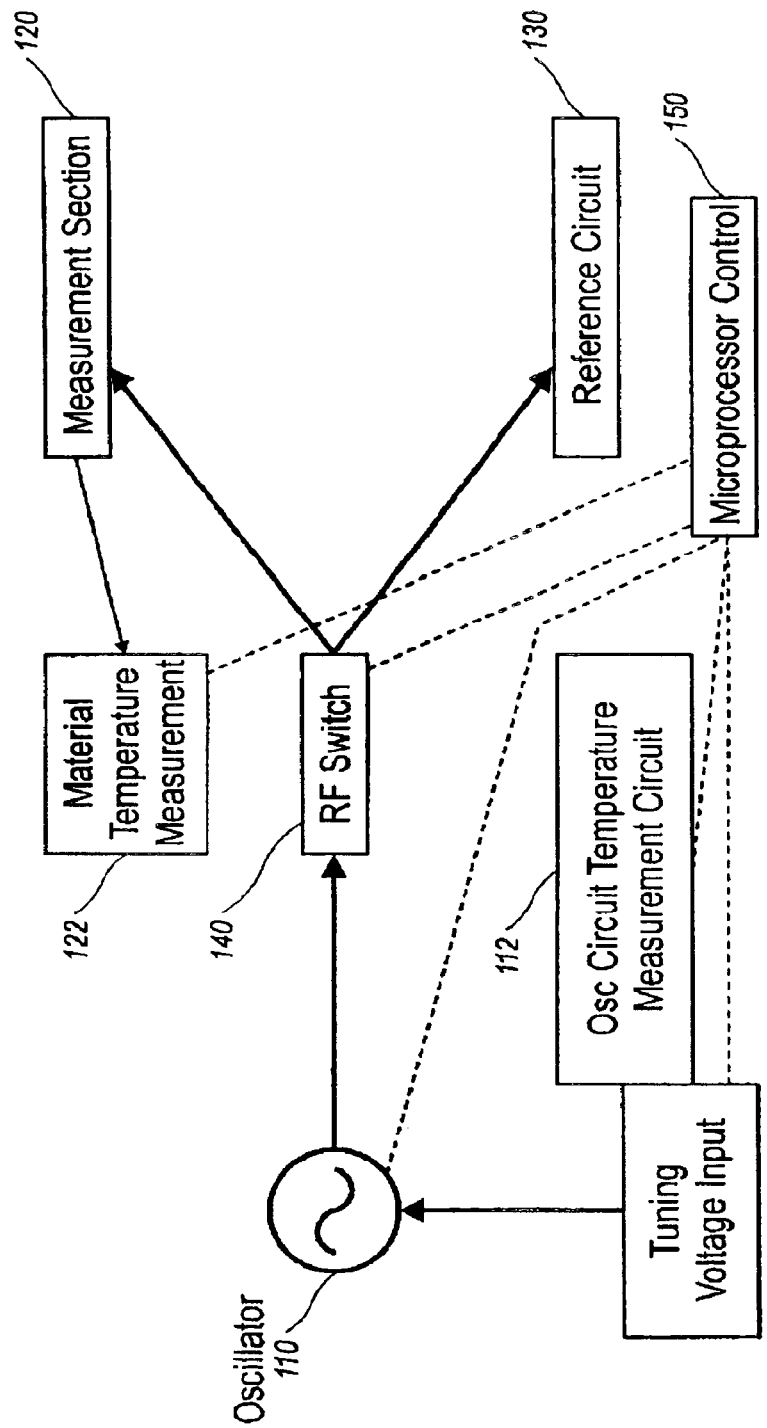
FIG. 1A shows a block diagram of the innovative load-pulled measurement system.

FIG. 1A shows a block diagram of the innovative load-pulled measurement system. The oscillator 110 is thermally coupled, in this sample embodiment, to a temperature measurement circuit 112, which interfaces to a microprocessor control unit 150'. An RF switch 140 connects the oscillator 110 to a measurement section 120 and/or to a reference circuit 130.

The reference circuit 130, in this sample embodiment, is a pure resistance (which is impedance-matched to avoid reflections). Alternatively, this can be a lumped reactive element, or a section of coax terminated by a matched resistance, or a section of coax terminated by a mismatched resistance, or have other configurations.

The microprocessor control stage 150' is interfaced, in this sample embodiment, to provide a tuning voltage input to oscillator 110, to receive a circuit temperature value from temperature measurement stage 112, to receive a material temperature value from temperature measurement stage 122, to control the RF switch 140, and to detect the frequency of oscillator 110. The microprocessor can compare the oscillator frequencies before and after switching from reference load to the measurement load, and derive an output indicating the measurement of interest. The two temperature inputs, in this sample embodiment, can also be used to improve the accuracy of measurements, by use of stored process curves or polynomial fits to curves.

When using a voltage-controlled oscillator, the microprocessor preferably drives the tuning voltage, while the reference load is connected, to bring the oscillator to a desired starting frequency. (The starting frequency is preferably picked to avoid possible "roll over.") When the measurement load is switched in, the shift in frequency provides a measurement output, which can be modified using the temperature inputs.

Figure 1B:
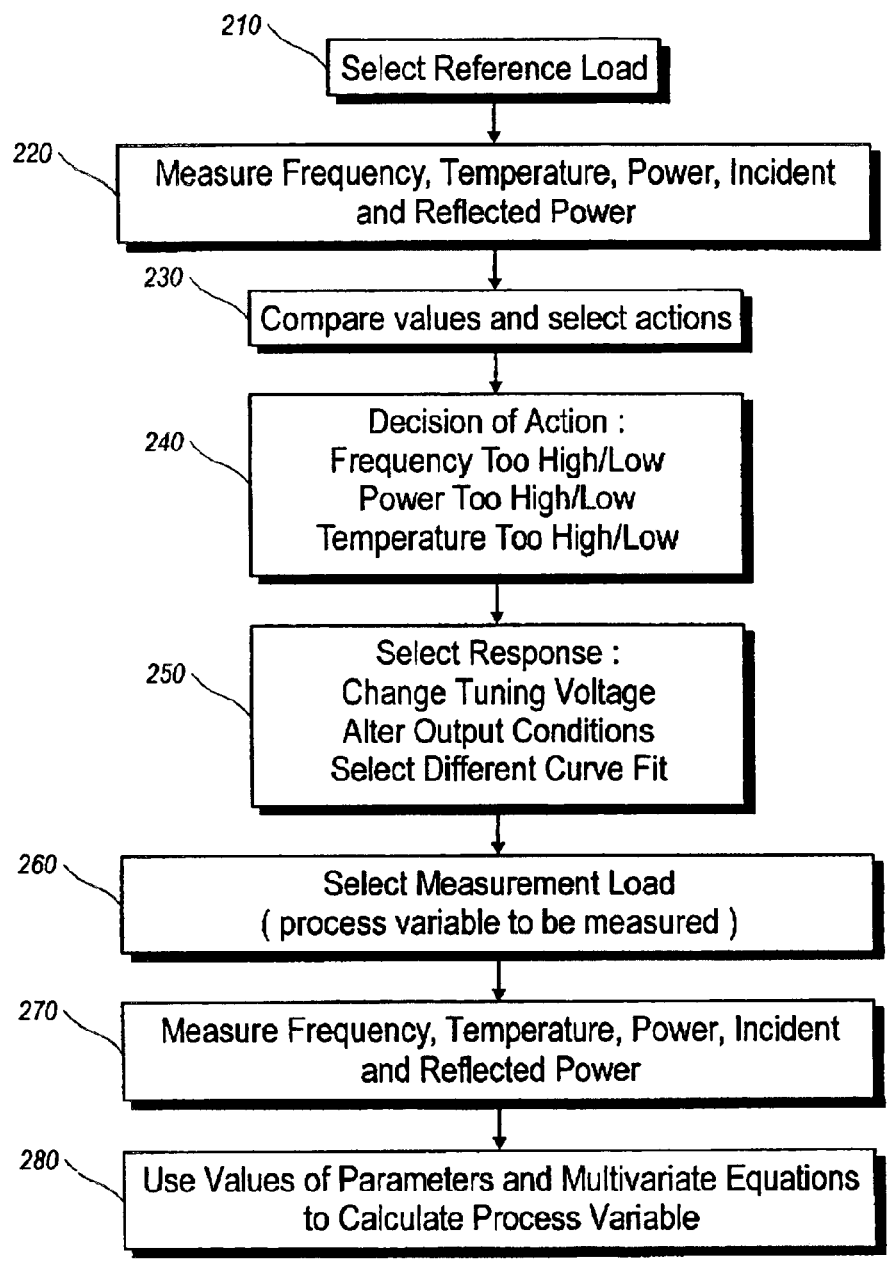
FIG. 1B is a flowchart showing the sequence of operations in a sample method embodiment which uses e.g. the system of FIG. 1A.

FIG. 1B is a flowchart showing the sequence of operations in a sample method embodiment which uses e.g. the system of FIG. 1A (or other system as disclosed herein).

In operation, the oscillator 110 is first (step 210) connected, through RF switch 140, into the reference load 130. Next the frequency, circuit temperature, power, and incident/reflected ratios are measured (step 220). Next (step 230) a multivariate equation set (determined by factory calibration incorporating the temperature of the circuit and parameters relating to non-linear effects) is used to select the appropriate reference frequency. If a change is needed (step 240), then appropriate action is taken (step 250): the tuning voltage is changed if the reference frequency needs to shift, or a bias element can be switched into or out of the output, and/or the stored lookups used to translate oscillator frequency into measured process variable values can be changed.

Next (step 260) the RF switch 140 is reconfigured to select the measurement load 120, and (step 270) the frequency, temperature, power, and incident/reflected power ratios are measured. An appropriate computation and/or lookup operation (step 280) is then used to obtain the desire value for the process variable(s) being measured.

In this embodiment (but not all embodiments), frequency is measured into the load and the microprocessor control circuit changes the tuning voltage on the tuning circuit in the oscillator to obtain a fixed reference frequency.

In this embodiment (but not all embodiments), the microprocessor also uses the ambient circuit temperature to further adjust the reference frequency to compensate for non-linear effects of temperature on transistor gain or other parameters which interact with temperature compensation of the entire circuit.

According to a disclosed class of innovative embodiments, there is provided: A load-pulled-oscillator system, comprising: an oscillator having a feedback connection; a switch which controllably connects said feedback connection either to a measurement load element which is variably loaded by proximity to a substance to be characterized, or a reference load element having a fixed impedance; logic connected to measure the frequency of said oscillator in both positions of said switch; whereby comparison of oscillator frequency between the positions of said switch allows operating point compensation.

According to another disclosed class of innovative embodiments, there is provided: A load-pulled-oscillator system, comprising: a voltage-controlled oscillator having a feedback connection; a switch which controllably connects said feedback connection either to a measurement load element which is variably loaded by proximity to a substance to be characterized, or a reference load element having a fixed impedance; logic connected to measure the frequency of said oscillator while connected to said measurement load element, drive said oscillator toward a predetermined reference frequency while connected to said reference load element, and measure the frequency of said oscillator while connected to said measurement load element; whereby comparison of oscillator frequency between the positions of said switch, allows for temperature dependence to be compensated.

According to another disclosed class of innovative embodiments, there is provided: A load-pulled-oscillator system, comprising: a free-running oscillator having a feedback connection; a switch which controllably connects said feedback connection either to a measurement load terminal which connects said feedback connection to a load element which is variably loaded by proximity to a substance to be characterized, or a reference load terminal which connects said feedback connection to a load element having a fixed impedance; logic connected to measure the frequency of said oscillator in both positions of said switch; whereby comparison of oscillator frequency between the positions of said switch allows operating point compensation.

According to another disclosed class of innovative embodiments, there is provided: A load-pulled-oscillator system, comprising: means for monitoring the frequency of an oscillator means for connecting said oscillator to be loaded by a measurement load element which is variably loaded by proximity to a substance to be characterized, and/or selectably a reference load element having a fixed impedance; whereby comparison of oscillator frequency between the positions of said switch allows for temperature dependence to be compensated.

According to another disclosed class of innovative embodiments, there is provided: A load-pulled-oscillator system, comprising: an oscillator having a feedback connection; a switch which controllably connects said feedback connection to a measurement load element which is variably loaded by proximity to a substance to be characterized, and which is a distributed element, and/or a reference load element which is a lumped element; whereby comparison of oscillator frequency between the positions of said switch allows for temperature dependence to be compensated.

According to another disclosed class of innovative embodiments, there is provided: A load-pulled-oscillator system, comprising: a free-running oscillator having a feedback connection; a switch which controllably connects said feedback connection to a measurement load element which is variably loaded by proximity to a substance to be characterized, and/or to a reference load element; and circuitry-which measures the frequency and insertion loss of said oscillator; whereby comparison of oscillator frequency and insertion loss between the positions of said switch allows for temperature dependence to be compensated.

According to another disclosed class of innovative embodiments, there is provided: A method for operating a load-pulled-oscillator system, comprising the actions of: controllably connecting a feedback connection of a free-running oscillator either to a measurement load element which is variably loaded by proximity to a substance to be characterized, or a reference load element having a fixed impedance; and measuring the frequency of said oscillator in both positions of said switch; whereby comparison of oscillator frequency between the positions of said switch allows for the operating point of said oscillator to be optimally compensated.

According to another disclosed class of innovative embodiments, there is provided: A method for operating a load-pulled-oscillator system, comprising the actions of: controllably connecting a feedback connection of a free-running oscillator either to a measurement load element which is variably loaded by proximity to a substance to be characterized, or a reference load element having a fixed impedance; and measuring the frequency and insertion loss of said oscillator in both positions of said switch; whereby comparison of oscillator frequency between the positions of said switch allows for the operating point of said oscillator to be optimally compensated.

According to another disclosed class of innovative embodiments, there is provided: A method for operating a load-pulled-oscillator system, comprising the actions of: controllably connecting a feedback connection of a free-running oscillator either to a distributed measurement load element which is variably loaded by proximity to a substance to be characterized, and/or a lumped reference load element having a fixed impedance; and measuring the frequency of said oscillator in both positions of said switch; whereby comparison of oscillator frequency between the positions of said switch allows for the operating point of said oscillator to be optimally compensated.

According to another disclosed class of innovative embodiments, there is provided: A method for operating a load-pulled-oscillator system, comprising the actions of: controllably connecting a feedback connection of a free-running oscillator either to a measurement load element which is variably loaded by proximity to a substance to be characterized, or a reference load element having a fixed impedance; measuring the frequency of said oscillator while connected to said reference load element, driving said oscillator toward a predetermined reference frequency while connected to said reference load element, and measuring the frequency of said oscillator while connected to said measurement load element; whereby comparison of oscillator frequency between the positions of said switch allows for temperature dependence to be compensated.

According to another disclosed class of innovative embodiments, there is provided: A method for operating a load-pulled-oscillator system, comprising the steps of: a step for monitoring the frequency of an oscillator; and a step for loading said oscillator selectably by a measurement load element which is variably loaded by proximity to a substance to be characterized and/or a reference load element having a fixed impedance; whereby comparison of oscillator frequency between the positions of said switch allows for the operating point of said oscillator to be optimally compensated.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

In a further alternative, a circuit heater can be used with the disclosed inventions.

While the disclosed inventions are particularly advantageous without a circuit heater, alternatively a heater can be included in the module to permit selection of heated and unheated modes of operation.

In a further alternative, a crude circuit heater can be used to tolerate extreme cold, while otherwise allowing the temperature of circuitry to vary over some substantial fraction of the ambient temperature range.

In a further alternative, a precision circuit heater can be kept off for normal operation, and powered up only for calibration, testing, or when selected by the operator.

In a further alternative, the reference load can be temperature-stabilized, whether or not the circuitry is. Thus reference levels can be set as precisely as possible using accurately temperature-controlled elements, and used as a basis for extrapolation using the above methods.

In a further alternative, the RF switch can be separately temperature-monitored (or even temperature-stabilized), if it is thermally separate from the oscillator circuitry.

Note that the disclosed inventions are not limited to switching between one measurement load and one reference load. In alternative embodiments pairs of loads can be switched over, or loads can be switched in various combinations. (For example, switching might be done from a first combination of two references and one sensor to a second combination of two sensors and one reference, e.g. R1R2S1 switching to R1S1S2.) Many other such combined configurations can be used. (Such configurations can be used to achieve cancellation of second-order temperature dependence, immunity to ambient RF noise, reliability, spatially resolved sensing, etc.)

In an alternative and less preferred class of embodiments, the measurement and reference stage can be given separate RF gain stages, and comparison performed by digitally offsetting frequencies. However, this requires very careful design to avoid cross-talk and coupled RF instabilities.

In a further alternative, the reference load can be paralleled with the measurement load under some circumstances, to further shift the frequency (especially if the reference load is not purely resistive).

Differential combinations of gain stages can be achieved by using a configuration similar to phase-locked loops, in which a load-pulled stage is driven to a desired oscillation frequency, and the control voltage coupled (through a capacitor or voltage mirror) to be an offset in the control voltage of a different VCO stage.

It is also contemplated that a lumped reference load can be even better than a distributed reference load, since a lumped load is inherently less well coupled to a volume of its environments.

Various load-pulled systems have been operated at frequencies ranging from VHF to X-band, but lower and higher frequencies can be used for particular applications if desired.

The measurement load is preferably a transmission line, but alternatively could be lumped (as in a patch antenna) or "infinite" (i.e. as in a logarithmic antenna).

The RF switch does not have to have only two positions, but alternatively one or more RF switches can be connected to reach any number of load elements. This can be particularly advantageous, for example, for monitoring a single reactor or cluster of reactors, where different measurement loads (and possibly reference loads) are mounted on different positions of the reactor(s).

The RF switches are preferably implemented using PIN diodes, but alternatively RF transistors can be used.

While system design is simplest with a voltage-controlled oscillator, the disclosed ideas can also be implemented with an oscillator which is NOT voltage-controlled: in fact, the present invention can be particularly advantageous with such configurations. (The robustness of measurement resulting from the use of the measurement load can compensate for the reduced flexibility in setting the initial operating frequency.)

One possible implementation of this is to use an RF switch to switch in additional reactances to pull the frequency of the oscillator, if desired.

Switching between the measurement and reference loads can be done in a variety of ways, e.g. hourly, every 3 seconds, or (less preferably) only upon operator command.

The switching does not have to be simply "in" or "out". Transmission lines can be varied by switchable elements such as pin diodes. Tuning stubs (shorted or open) can be removed, phase shifts can be made, and/or longer lengths can be added using these diodes and switching the circuits.

In a further alternative. If the reference frequency (looking at the reference load) is above a certain value, a pin diode in the load circuit which is part of the process measurement oscillator load can be switched to move the phase and amplitude value seen at the load pulled measurement oscillator. This would be done to shift the response due to say a temperature change that could not be compensated for by just moving the frequency itself. A different load impedance presented to the oscillator could now improve sensitivity or linearity where a frequency shift by itself without the impedance change may not solve any problems.

In further alternative embodiments it is also possible to cross-swap two oscillators, so that in one period oscillator A is connected to the measurement section (and oscillator B to the reference), and then these connections are reversed.

Longer measurement sections will tend to imply more sensitivity to shifts in the material being measured. A line which is electrically "long" might include two or more half-wavelengths; but even if the measurement load is not electrically long in this sense, it is still preferably distributed. (A transmission line is called distributed because it cannot be represented by any resistor, capacitor or inductor by itself. Instead, it must be characterized by an infinite series of shunt and series RLC pairs and groups. By contrast, lumped elements simply are resistors, inductors or capacitors that represent the loss, magnetic or electrical storage functions as such.) Once the frequency or method of physical implementation define the actual impedance to be changing values vs frequency or as a series/parallel or other combination thereof, then the lumped component becomes distributed. An example is an inductor where the turns of the wire from one winding to another are on top of each other. The proximity to the prior turn creates a capacitance between turns. At higher frequencies, this capacitance can no longer be neglected.

Note also that, in various embodiments, the logic can select different fitting curves, in dependence on the operating temperature regime, to further compensate higher-order effects.

In other embodiments, it is contemplated that two (or more) dissimilar load-pulled oscillators can be used: e.g. one with reduced sensitivity to cover a greater span, and a second for precise measurement. In some implementations of such cases the less sensitive oscillator can be partially (though not completely) isolated from the load if desired.

In a further embodiment of multiple VCOs, feedback control can also be implemented by a variable load device on the load of the measurement side of the line, e.g. a varactor on the output line which shifts the impedance a known amount relative to the temperature or reference, thereby further compensating the measurement load pulled oscillator.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle. Moreover, the claims filed with this application are intended to be as comprehensive as possible: EVERY novel and nonobvious disclosed invention is intended to be covered, and NO subject matter is being intentionally abandoned, disclaimed, or dedicated.

What is claimed is:

1. A load-pulled-oscillator system, comprising:
an oscillator having a feedback connection;
a switch which controllably connects said feedback connection either to
a measurement load element which is variably loaded by proximity to a substance to be characterized, or
a reference load element having a fixed impedance; and
logic connected to measure the frequency of said oscillator in both positions of said switch;
whereby comparison of oscillator frequency between the positions of said switch allows operating point compensation.

2. The system of claim 1, wherein said oscillator is a voltage-controlled oscillator.

3. The system of claim 1, wherein said logic is also connected to sense the temperature of said substance.

4. The system of claim 1, wherein said measurement load is a distributed element which extends over at least one quarter-wavelength at the frequency of option of said oscillator.

5. The system of claim 1, wherein said reference load is a lumped element.

6. A load-pulled-oscillator system, comprising:
a voltage-controlled oscillator having a feedback connection;
a switch which controllably connects said feedback connection either to
a measurement load element which is variably loaded by proximity to a substance to be characterized, or
a reference load element having a fixed impedance; and
logic connected to
measure the frequency of said oscillator while connected to said measurement load element,
drive said oscillator toward a predetermined reference frequency while connected to said reference load element, and
measure the frequency of said oscillator while connected to said measurement load element;
whereby comparison of oscillator frequency between the positions of said switch allows for temperature dependence to be compensated.

7. The system of claim 6, wherein said logic is also connected to sense the temperature of said substance.

8. The system of claim 6, wherein said measurement load is a distributed element which extends over at least one quarter-wavelength at the frequency of operation of said oscillator.

9. The system of claim 6, wherein said reference load is a lump element.

10. A load-pulled-oscillator system, comprising:
a free-running oscillator having a feedback connection;
a switch which controllably connects said feedback connection either to
a measurement load terminal which connects said feedback connection to a load element which is variably loaded by proximity to a substance to be characterized, or
a reference load terminal which connects said feedback connection to a load element having a fixed impedance; and
logic connected to measure the frequency of said oscillator in both positions of said switch;
whereby comparison of oscillator frequency between the positions of said switch allows operating point compensation.

11. The system of claim 10, wherein said oscillator is a voltage-controlled oscillator.

12. The system of claim 10, wherein said logic is also connected to sense the temperature of said substance.

13. The system of claim 10, wherein said measurement load is a distributed element.

14. The system of claim 10, wherein said reference load is a lumped element.

15. A load-pulled-oscillator system, comprising:
means for monitoring the frequency of an oscillator; and
means for correcting said oscillator to be loaded by
a measurement load element which is variably loaded by proximity to a substance to be characterized, and/or selectably
a reference load element having a fixed impedance;
whereby comparison of oscillator frequency between the positions of said means for connection allows for temperature dependence to be compensated.

16. The system of claim 15, wherein said oscillator is a voltage-controlled oscillator.

17. The system of claim 15, wherein said measurement load is a distributed element.

18. The system of claim 15, wherein said reference load is a lumped element.

19. A load-pulled-oscillator system, comprising:
an oscillator having a feedback connection; and
a switch which controllably connects said feedback connection to
a measurement load element which is variably loaded by proximity to a substance to be characterized and which is a distributed element, and/or
a reference load element which is a lumped element;
whereby comparison of oscillator frequency between the positions of said switch allows for temperature dependence to be compensated.

20. The system of claim 19, wherein said oscillator is a voltage-controlled oscillator.

21. A load-pulled-oscillator system, comprising:
a free-running oscillator having a feedback connection;
a switch which controllably connects said feedback connection to a measurement load element which is variably loaded by proximity to a substance to be characterized, and/or to a reference load element; and
circuitry which measures the frequency and insertion loss of said oscillator;
whereby comparison of oscillator frequency and insertion loss between the positions of said switch allows for temperature dependence to be compensated.

22. The system of claim 21, wherein said oscillator is a voltage-controlled oscillator.

23. The system of claim 21, wherein said circuitry is also connected to sense the temperature of said substance.

24. The system of claim 21, wherein said measurement load element is a distributed element.

25. The system of claim 21, wherein said reference load is a lumped element.

26. A method for operating a load-pulled-oscillator system, comprising the actions of:
controllably connecting a feedback connection of a free-running oscillator either to
a measurement load element which is variably loaded by proximity to a substance to be characterized, or
a reference load element having a fixed impedance; and
measuring the frequency of said oscillator in both positions of said feedback connection;
whereby comparison of oscillator frequency between the positions of said feedback connection allows for the operating point of said oscillator to be optimally compensated.

27. The method of claim 26, wherein said oscillator is a voltage-controlled oscillator.

28. The method of claim 26, comprising the further action of sensing the temperature of said substance.

29. The method of claim 26, wherein said measurement load is a distributed element.

30. The method of claim 26, wherein said reference load is a lumped element.

31. A method for operating a load-pulled-oscillator system, comprising the actions of:
controllably connecting a feedback connection of a free-running oscillator either to
a measurement load element which is variably loaded by proximity to a substance to be characterized, or
a reference load element having a fixed impedance; and
measuring the frequency and insertion loss of said oscillator in both positions of said feedback connection;
whereby comparison of oscillator frequency between the positions of said feedback connection allows for the operating point of said oscillator to be optimally compensated.

32. The method of claim 31, wherein said oscillator is a voltage-controlled oscillator.

33. The method of claim 31, comprising the further action of sensing the temperature of said substance.

34. The method of claim 31, wherein said reference load is a lumped element.

35. A method for operating a load-pulled-oscillator system, comprising the actions of:
controllably connecting a feedback connection of a free-running oscillator either to
a distributed measurement load element which is variably loaded by proximity to a substance to be characterized, and/or
a lumped reference load element having a fixed impedance; and
measuring the frequency of said oscillator in both positions of said feedback connection;
whereby comparison of oscillator frequency between the positions of said feedback connection allows for the operating point of said oscillator to be optimally compensated.

36. The method of claim 35, wherein said oscillator is a voltage-controlled oscillator.

37. The method of claim 35, comprising the further action of sensing the temperature of said substance.

38. A method for operating a load-pulled-oscillator system, comprising the actions of:
controllably connecting a feedback connection of a free-running oscillator either to
a measurement load element which is variably loaded by proximity to a substance to be characterized, or
a reference load element having a fixed impedance;
measuring the frequency of said oscillator while connected to said reference load element,
driving said oscillator toward a predetermined reference frequency while connected to said reference load element, and
measuring the frequency of said oscillator while connected to said measurement load element;
whereby comparison of oscillator frequency between the positions of said feedback connection allows for temperature dependence to be compensated.

39. The method of claim 38, comprising the further action of sensing the temperature of said subs.

40. The method of claim 38, wherein said measurement load is a distributed element which extends over at least one quarter-wavelength at the frequency of operation of said oscillator.

41. The method of claim 38, wherein said reference load is a lumped element.

42. A method for operating a load-pulled-oscillator system, comprising the steps of:
a step for monitoring the frequency of an oscillator; and
a step for loading said oscillator selectably by
a measurement load element which is variably loaded by proximity to a substance to be characterized and/or
a reference load element having a fixed impedance;
whereby comparison of oscillator frequency between the positions of said step for loading said oscillator selectably by said measurement load and/or said reference load allows for the operating point of said oscillator to be optimally compensated.

43. The method of claim 42, wherein said oscillator is a voltage-controlled oscillator.

44. The method of claim 42, wherein said reference load is a lumped element.

* * * * *